United States Patent
Bharatham

(10) Patent No.: US 9,673,175 B1
(45) Date of Patent: Jun. 6, 2017

(54) HEAT SPREADER FOR PACKAGE-ON-PACKAGE (POP) TYPE PACKAGES

(71) Applicant: FREESCALE SEMICONDUCTOR, INC., Austin, TX (US)

(72) Inventor: Logendran Bharatham, Seremban (MY)

(73) Assignee: FREESCALE SEMICONDUCTOR,INC., Austin, TX (US)

( * ) Notice: Subject to any disclaimer, the term of this patent is extended or adjusted under 35 U.S.C. 154(b) by 0 days.

(21) Appl. No.: 14/835,534

(22) Filed: Aug. 25, 2015

(51) Int. Cl.
*H01L 23/02* (2006.01)
*H01L 23/48* (2006.01)
*H01L 23/10* (2006.01)
*H01L 23/34* (2006.01)
*H01L 25/065* (2006.01)
*H01L 23/367* (2006.01)
*H01L 23/498* (2006.01)
(Continued)

(52) U.S. Cl.
CPC ...... *H01L 25/0657* (2013.01); *H01L 23/3675* (2013.01); *H01L 23/49816* (2013.01); *H01L 23/49833* (2013.01); *H01L 23/49838* (2013.01); *H01L 23/34* (2013.01); *H01L 23/345* (2013.01); *H01L 23/36* (2013.01); *H01L 23/367* (2013.01); *H01L 25/105* (2013.01); *H01L 2225/06517* (2013.01); *H01L 2225/06555* (2013.01); *H01L 2225/06572* (2013.01); *H01L 2225/06589* (2013.01); *H01L 2225/107* (2013.01); *H01L 2225/1041* (2013.01); *H01L 2924/15311* (2013.01)

(58) Field of Classification Search
CPC ............... H01L 25/0657; H01L 25/105; H01L 2924/15311; H01L 2924/01079; H01L 2224/48091; H01L 23/36; H01L 23/367; H01L 23/34; H01L 23/345; H01L 2225/1041; H01L 2225/107
USPC .......................... 257/686, 706, 777, 693, 712
See application file for complete search history.

(56) References Cited

U.S. PATENT DOCUMENTS 6,008,991 A * 12/1999 Hawthorne ......... H01L 23/3672
206/701
7,960,827 B1 6/2011 Miller, Jr. et al.
(Continued)

OTHER PUBLICATIONS

William A. Pearlman, "An Example of SPECK Coding," http://www.cipr.rpi.edu/people/faculty/pearlman.html/papers/speck_example.pdf, c. 2013 (3 pages).

*Primary Examiner* — Teresa M Arroyo
(74) *Attorney, Agent, or Firm* — Charles E. Bergere

(57) ABSTRACT

A package-on-package (PoP) device has a first package and an interposer heat spreader. The first package includes a die and a substrate. The substrate has die contact pads, top contact pads, bottom contact pads, and interconnects between the die contact pads, the top contact pads, and the bottom contact pads. The die is electrically connected to the die contact pads. The top contact pads are adapted to be electrically connected to a second package to form the PoP device. The heat spreader has a central section thermo-conductively connected to the die. The heat spreader includes at least one arm connected to the central section and extending out past an edge of the first package. The heat spreader also has openings for electrical interconnects between the first package and the second package.

20 Claims, 12 Drawing Sheets

(51) Int. Cl.
*H01L 25/10* (2006.01)
*H01L 23/36* (2006.01)

(56) References Cited

U.S. PATENT DOCUMENTS

| | | | | |
|---|---|---|---|---|
| 2005/0112796 | A1* | 5/2005 | Ararao | H01L 21/4878 438/106 |
| 2007/0017686 | A1* | 1/2007 | Numata | H01L 23/367 174/17 VA |
| 2007/0069370 | A1* | 3/2007 | Sato | H01L 23/36 257/706 |
| 2009/0294941 | A1* | 12/2009 | Oh | H01L 23/552 257/686 |
| 2010/0276799 | A1* | 11/2010 | Heng | H01L 21/50 257/704 |
| 2012/0126388 | A1* | 5/2012 | Lin | H01L 21/56 257/690 |
| 2012/0241967 | A1* | 9/2012 | Kim | H01L 25/105 257/773 |
| 2012/0299173 | A1 | 11/2012 | Mohammed et al. | |
| 2013/0093073 | A1 | 4/2013 | Chen et al. | |
| 2014/0340849 | A1* | 11/2014 | Kim | H01L 23/34 361/717 |
| 2015/0115424 | A1* | 4/2015 | Riviere | H01L 25/0657 257/675 |

* cited by examiner

203

203

HEAT SPREADER FOR PACKAGE-ON-PACKAGE (POP) TYPE PACKAGES

BACKGROUND

The present invention relates to integrated circuit (IC) packages and, more particularly, to a heat spreader for package-on-package (PoP) type packages.

A conventional PoP device has top and bottom packaged devices, for example where the bottom packaged device is a processor and the top packaged device is a memory. The top and bottom packages may be assembled by different manufacturers and then the PoP device assembled by a third party. PoP devices are useful because they provide the third party the flexibility to match a particular processor with any one of a variety of compatible memory modules while reducing the footprint of the combined package, which is the footprint of the bottom package. In contrast, conventional stacked-die packages, which combine a processor and one or more memory modules in one integrated package, offer a similarly reduced footprint, but without the ability to combine devices from separate manufactures and without the ability to use known good devices.

FIG. 1 is a cross-sectional side view of a conventional PoP package 100. The PoP package 100 comprises a bottom package 101, a top package 102, and an interposer 103, which are generally square-shaped when viewed from above (not shown). The bottom package 101 comprises a processor die 104 electrically and adhesively connected to a substrate 105 via, respectively, conductive balls 106 and an underfill 107. The underfill 107 may include a die-attach material. The substrate 105 is a redistribution layer comprising die contact pads 108, PoP contact pads 109, bottom contact pads 110, filler 111, and conductive paths 112. The conductive paths 112 electrically interconnect corresponding die contact pads 108, PoP contact pads 109, and/or bottom contact pads 110. The conductive paths 112 and the contact pads 108 and 110 are metallic, while the filler 111 is a non-conductive dielectric material. The conductive balls 106 are physically and electrically connected to the corresponding die contact pads 108. Package conductive balls 113 are physically and electrically connected to corresponding bottom contact pads 110.

The top package 102 comprises two memory dies 120, with the die 120(1) stacked on top of the die 120(2). The die 120(2) is attached to a substrate 121. Each die 120 is wire bonded to corresponding contacts 122 on the top of the substrate 121 via wires 123. The dies 120, the wires 123, and the top of the substrate 121 are encapsulated with an encapsulant 124. The contacts 122 connect to bottom contacts pads 125 using vias 126 through the substrate 121. The bottom contact pads 125 are arranged in a plurality of concentric rectangles around the periphery of the bottom of the substrate 121 of the top package 102. A set of conductive balls 127 is attached to the bottom contact pads 125.

The interposer 103 connects the bottom contact pads 125 of the top package 102 to the PoP contact pads 109 of the bottom package 101 via the conductive balls 127 and 130. The interposer 103 comprises (i) a plurality of top contact pads 131 that correspond to the bottom contact pads 125 of the top package 102 and the conductive balls 127, (ii) a plurality of bottom contact pads 132 that correspond to the PoP contact pads 109 of the bottom package 101 and the conductive balls 130, (iii) a filler 133, and (iv) conductive paths 134 connecting the top contact pads 131 to the corresponding bottom contact pads 132. The conductive paths 134 and contacts pads 131 and 132 are metallic, while the filler 133 is a non-conductive dielectric material. A number of conductive balls 130—corresponding to the bottom contact pads 132 of the interposer 103 and the PoP contacts pads 109 of the bottom package 101—are connected to the bottom contact pads 125.

When the PoP package 100 is assembled, (i) the conductive balls 130 of the interposer 103 are connected—e.g., using a reflow process—to the corresponding PoP contact pads 109 of the bottom package 101 and (ii) the conductive balls 127 of the top package 102 are connected—e.g., using the same or different reflow process—to the corresponding top contact pads 131 of the interposer 103. Once the PoP package 100 is assembled, the die 104 of the bottom package 101 communicates with (i) the dies 120 of the top package 102 via the interposer 103 and (ii) external components (not shown) via the conductive balls 113.

In operation, the die 104 generates heat which, if excessive, may damage itself and/or other components of the PoP package 100.

BRIEF DESCRIPTION OF THE DRAWINGS

Other aspects, features, and advantages of the invention will become more fully apparent from the following detailed description, the appended claims, and the accompanying drawings in which like reference numerals identify similar or identical elements. Note that elements in the figures are not drawn to scale.

DETAILED DESCRIPTION

Detailed illustrative embodiments of the present invention are disclosed herein. However, specific structural and functional details disclosed herein are merely representative for purposes of describing example embodiments of the present invention. Embodiments of the present invention may be embodied in many alternative forms and should not be construed as limited to only the embodiments set forth herein. Further, the terminology used herein is for the purpose of describing particular embodiments only and is not intended to be limiting of example embodiments of the invention.

As used herein, the singular forms "a," "an," and "the," are intended to include the plural forms as well, unless the context clearly indicates otherwise. It further will be understood that the terms "comprises," "comprising," "has," "having," "includes," and/or "including" specify the presence of stated features, steps, or components, but do not preclude the presence or addition of one or more other features, steps, or components. It also should be noted that, in some alternative implementations, the functions/acts noted may occur out of the order noted in the figures.

Components that help dissipate heat generated by the dies of the bottom packages in PoP packages may help prolong the life of the PoP packages and/or prevent damage to components of the PoP packages. In some embodiments, interposer heat spreaders are used to dissipate heat from the dies of the bottom packages in PoP packages.

Figure 2:
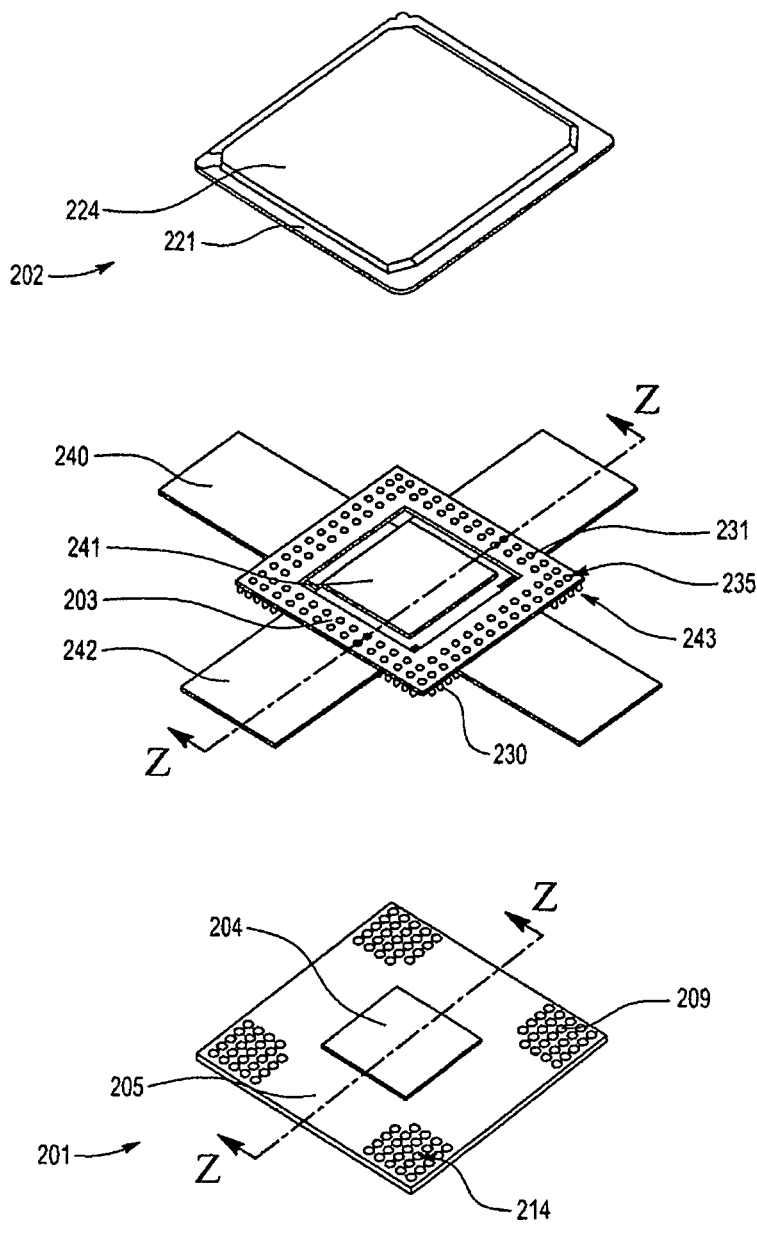
FIG. 2 is an exploded perspective view of a PoP package in accordance with one embodiment of the present invention.
Figure 3:
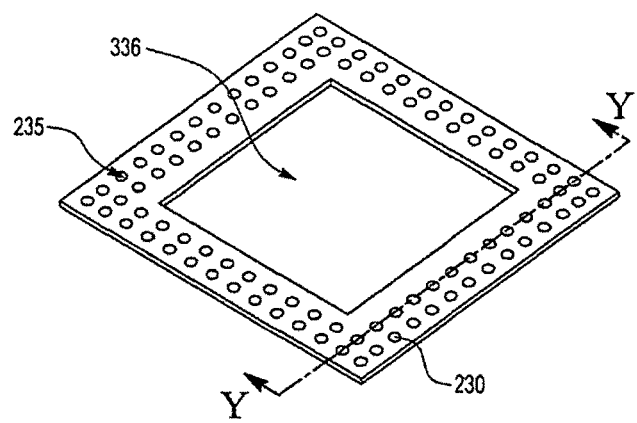
FIG. 3 is a perspective view of the interposer of FIG. 2.
Figure 4:
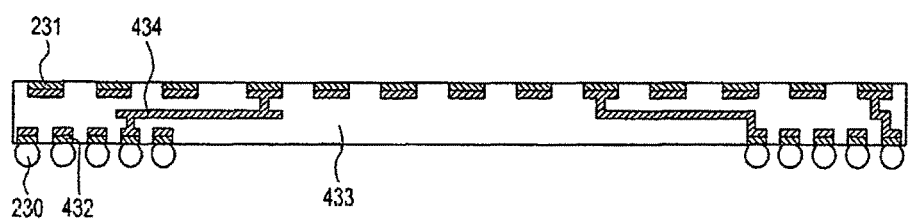
FIG. 4 is a side cross-sectional view of the interposer of FIG. 3.
Figure 5:
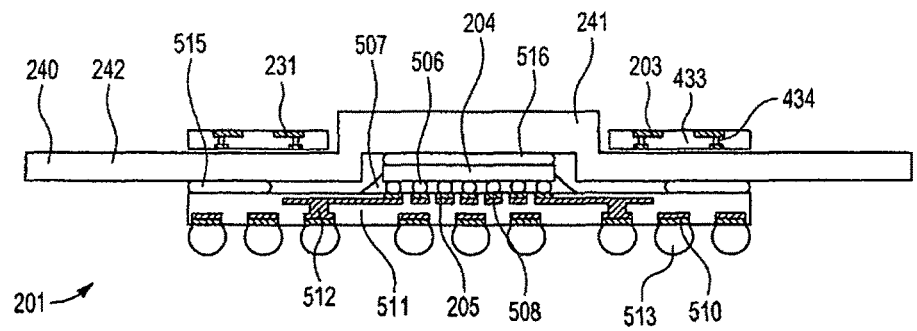
FIG. 5 is a side cross-sectional view of the interposer, the interposer heat spreader, and the bottom package of FIG. 2.

FIG. 2 is an exploded perspective view of a PoP package 200 in accordance with one embodiment of the present invention. FIG. 3 is a perspective view of the interposer 203 of FIG. 2. FIG. 4 is a side cross-sectional view of the interposer 203 along cut-line Y-Y of FIG. 3. FIG. 5 is a side cross-sectional view of the interposer 203, the interposer heat spreader 240, and the bottom package 201 along cut-line Z-Z of FIG. 2.

The PoP package 200 comprises a bottom package 201, a top package 202, an interposer 203, and an interposer heat spreader 240. When assembled together, the packages 201 and 202, the interposer 203, and the heat spreader 240 form the PoP package 200, which is ready for attachment to a printed circuit board (PCB) or other external system (not shown).

Figure 1:
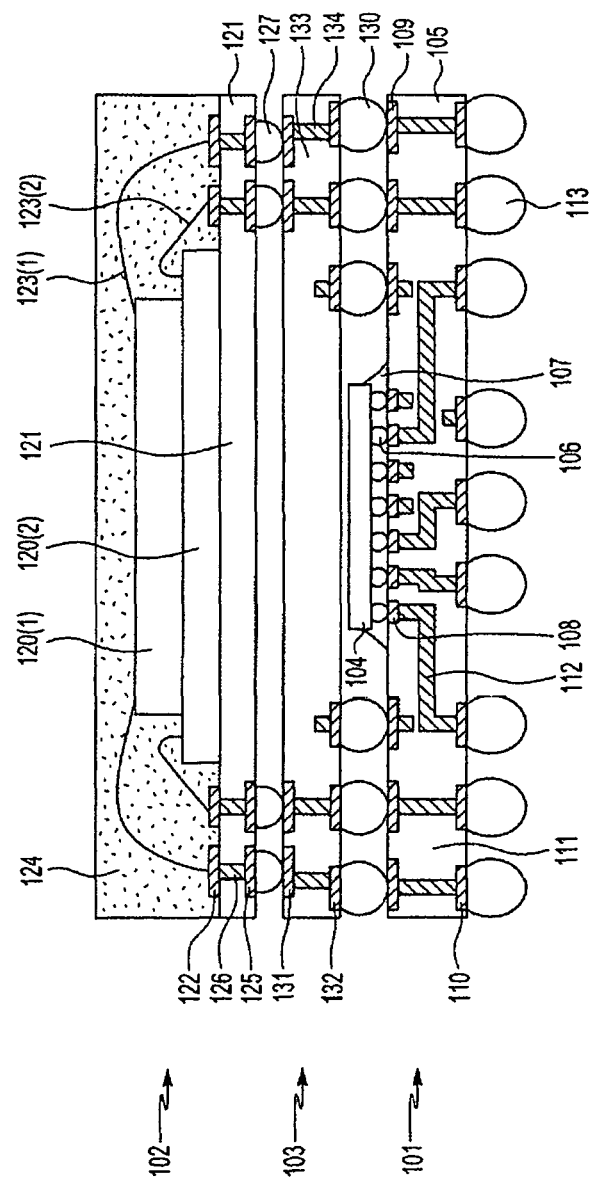
FIG. 1 is a cross-sectional side view of a conventional PoP package.

The top package 202 is substantially similar to the conventional top package 102 of FIG. 1. The top package 202 comprises one or more dies (not shown) attached to a substrate 221 and encapsulated in an encapsulant 224. The one or more dies of the top package 202 may be of any suitable type and may be electrically connected via any suitable connective paths (not shown) via the substrate 221 to bottom contact pads (not shown) and corresponding conductive balls (not shown) at the bottom of the substrate 221 of the top package 202. The contact pads at the bottom of the substrate 221 of the top package 202 are arranged around the periphery of the bottom of the substrate 221.

The heat spreader 240 comprises a rectangular central section 241 connected to four arms 242, where each arm 242 extends out from a corresponding side of the central section 241 past the edges of the bottom package 201. The central section 241 is shaped to accommodate the below-described die 204 of the bottom package 201. Specifically, the central section 241 is elevated relative to the arms 242 to form a rectangular dome over the die 204.

The heat spreader 240 comprises a thermo-conductive material such as, for example, copper or aluminum. The heat spreader 240 may, for example, be formed from a metal sheet by cutting, punching, pressing, stamping, and/or any other suitable sheet-metal shaping processes. The heat spreader 240 may, in addition, be coated with a protective layer, e.g., nickel, to prevent corrosion.

The interposer 203 is a rectangular frame having four corner regions 235. In the central area of the interposer 203 is an opening 336 into which fits the central section 241 of the heat spreader 240. The top of the interposer 203 comprises top contact pads 231 arranged to match the above-described contact pads of the bottom of the top package 202. In other words, the top contact pads 231 are arranged as concentric rectangles.

The interposer 203 comprises bottom contact pads 432 on the bottom of the interposer 203, located in the four corners 235. The conductive balls 230 are connected to the bottom contact pads 432 of the interposer 203. The heat spreader 240 is shaped to provide openings 243 for the conductive balls 230, which form part of the interconnections between the top package 202 and the bottom package 201. The interposer 203 further comprises a filler 433 and conductive paths 434. The conductive paths 434 connect the top contact pads 231 to corresponding bottom contact pads 432.

The bottom package 201 comprises a die 204 electrically and physically connected to a rectangular substrate 205 with, respectively, conductive balls 506 and underfill 507. The substrate 205 has four corner areas 214 that comprise top contact pads 209 arranged to correspond to the bottom contact pads 432 and the conductive balls 230 of the interposer 203. The bottom package 201 is substantially similar to the bottom package 101 of FIG. 1, except that the top contact pads 209 are located in the corner areas 214 rather than being located all around the periphery as in the bottom package 101.

The substrate 205 further comprises die contact pads 508—which correspond to the conductive balls 506, the filler 511, the conductive paths 512, and the bottom contact pads 510. The conductive paths 512 provide connections among the top contact pads 209, the die contact pads 508, and the bottom contact pads 510.

Note that the one or more dies of the top package 202 may communicate directly with external components via the conductive balls 513 and the above-described conductive pathways 512 and 434 through, respectively, the substrate 205 and the interposer 203—in other words, bypassing the die 204. Conductive balls 513 are attached to the bottom contact pads 510. A thermo-conductive paste 516, which may also be adhesive, is applied between the top of the die 204 and the bottom of the central section 241 of the heat spreader 240 in order to improve the dissipation of heat from the die 204. An adhesive 515 is applied between at least some overlapping portions of the arms 242 of the heat spreader 240 and the top of the substrate 205 of the bottom package 201.

The assemblage of the bottom package 201, the interposer 203, and the heat spreader 240 may be assembled together and then provided to a third party for attachment to a top package 202 of the third party's choice for forming the PoP package 200. The assembled PoP package 200 has superior heat dissipation properties compared to the PoP package 100 of FIG. 1 because heat generated by the die 204 can be dissipated by the arms 242 of the heat spreader 240, which extend outside of the PoP package 200, past the edges of the bottom package 201.

Figure 6:
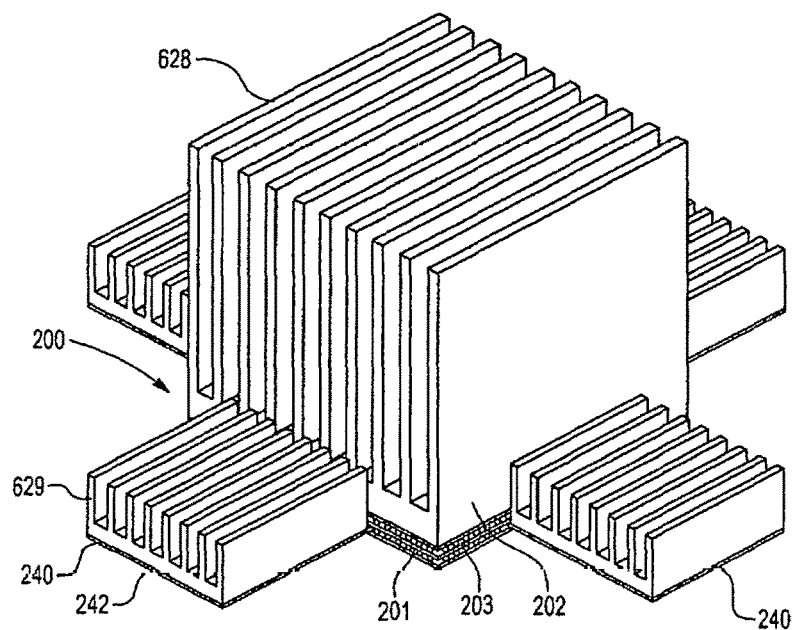
FIG. 6 is a perspective view of the PoP package of FIG. 2, assembled and with the addition of optional heat sinks.

FIG. 6 is a perspective view of the PoP package 200 of FIG. 2, assembled and with the addition of optional heat sinks 628 and 629. The heat sink 628 is attached to the top of the top package 202. The four heat sinks 629 are attached to the four arms 242 of the heat spreader 240. The heat sinks 629, by providing increased surface area, help further improve the dissipation of heat produced by the die 204 of the bottom package 201. The heat sink 628 helps dissipate heat produced by the dies of the top package 202.

Figure 7:
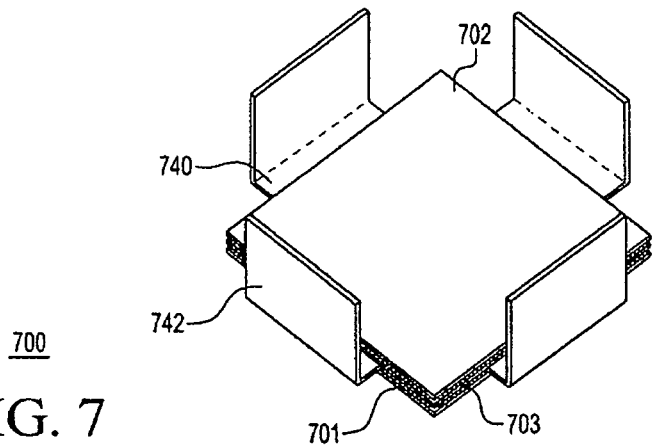
FIG. 7 is a perspective view of a PoP package in accordance with an alternative implementation of the invention.
Figure 8:
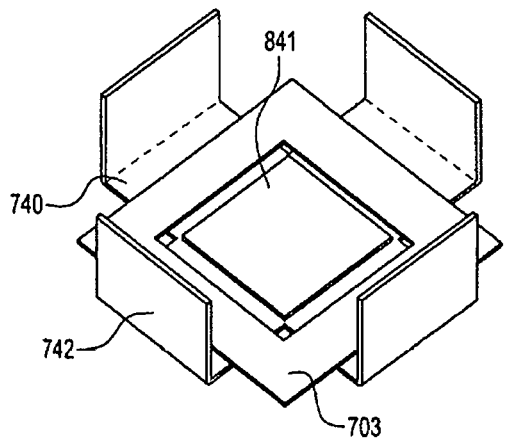
FIG. 8 is a perspective view of the interposer and the interposer heat spreader of the PoP package of FIG. 7.
Figure 9:
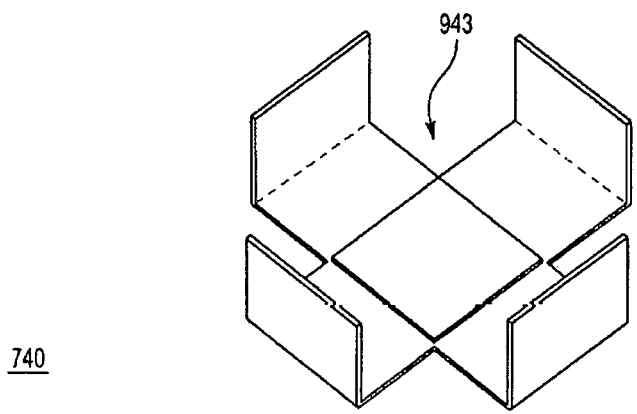
FIG. 9 is a perspective view of the heat spreader of FIG. 7.

FIG. 7 is a perspective view of a PoP package 700 in accordance with an alternative implementation of the invention. FIG. 8 is a perspective view of the interposer 703 and the interposer heat spreader 740 of the PoP package 700 of FIG. 7. FIG. 9 is a perspective view of the heat spreader 740 of FIG. 7. The PoP package 700 comprises a top package 702, an interposer 703, an interposer heat spreader 740, and a bottom package 701. The heat spreader 740 comprises four arms 742 and a central section 841, and has openings 943 for the interconnections between the top package 702 and the bottom package 701.

The PoP package 700 is substantially the same as the PoP package 200 of FIGS. 2-5, except that the arms 742 of the heat spreader 740 are bent upwards in their portions that extend past the edges of the bottom package 701, which helps reduce the footprint of the PoP package 700 compared to that of the PoP package 200 of FIG. 2. Note that elements of the PoP package 700 that correspond to elements of the PoP package 200 are similarly labeled but with a different prefix.

Figure 10:
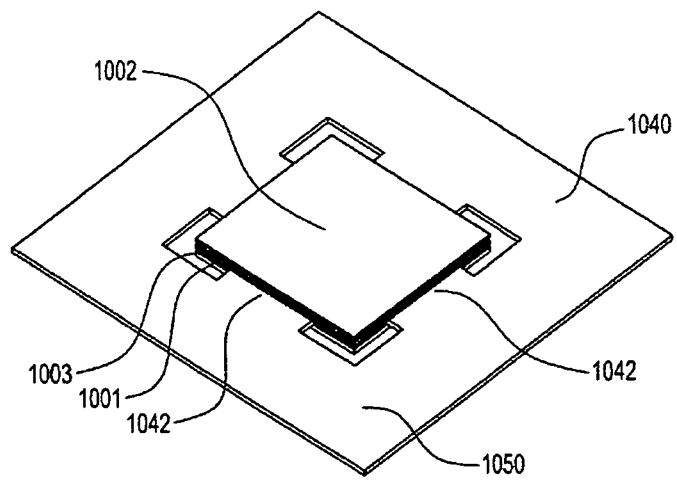
FIG. 10 is a perspective view of a PoP package in accordance with another alternative implementation of the invention.
Figure 11:
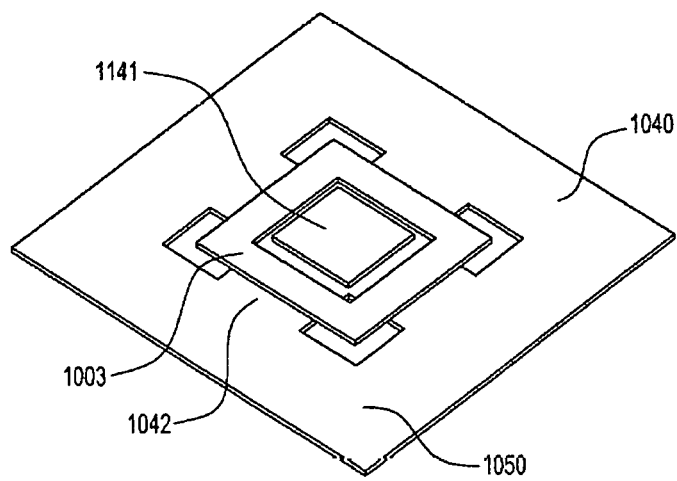
FIG. 11 is a perspective view of the interposer and the interposer heat spreader of the PoP package of FIG. 10.
Figure 12:
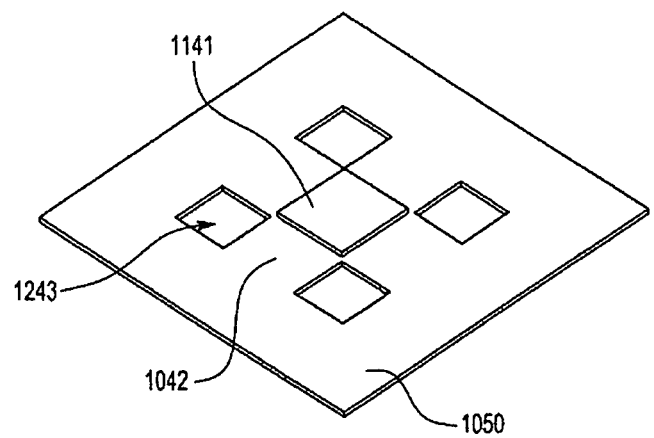
FIG. 12 is a perspective view of the heat spreader of FIG. 10.

FIG. 10 is a perspective view of a PoP package 1000 in accordance with another alternative implementation of the invention. FIG. 11 is a perspective view of the interposer 1003 and the interposer heat spreader 1040 of the PoP package 1000 of FIG. 10. FIG. 12 is a perspective view of the heat spreader 1040 of FIG. 10. The PoP package 1000 comprises a top package 1002, a bottom package 1001, an interposer 1003, and an interposer heat spreader 1040. The packages 1001 and 1002 and the interposer 1003 are substantially the same as the packages 201 and 202 and the interposer 203 of FIG. 2. Note that elements of the PoP package 1000 that correspond to elements of the PoP package 200 are similarly labeled but with a different prefix.

The heat spreader 1040 comprises four arms 1042 that extend from the central portion 1141 out past the edges of the top package 1002 and which connect to an outer rectangular ring 1050, which forms part of the heat spreader 1040. The heat spreader 1040 also has four openings 1243 for the interconnections between the top package 1002 and the bottom package 1001. The outer ring 1050 increases the package-external surface area of the heat spreader 1040 and, consequently, helps increase the dissipation of heat from inside of the PoP package 1000. Note that alternative implementations may have outer rings of other shapes. For example, alternative outer rings 1050 may be circular rings, oval rings, open rings, or have more intricate shapes.

Figure 13:
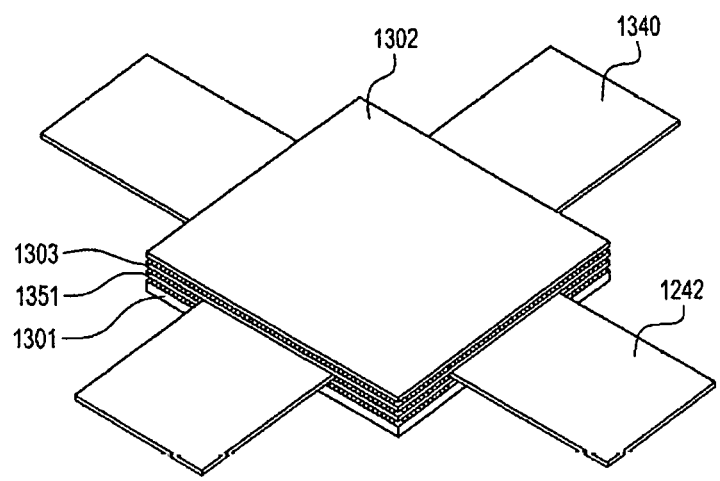
FIG. 13 is a perspective view of a PoP package in accordance with another alternative implementation of the invention.
Figure 14:
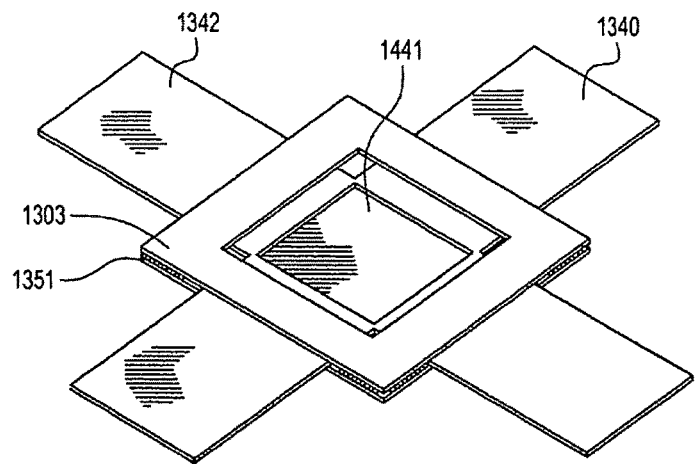
FIG. 14 is a perspective view of the top interposer, the bottom interposer, and the interposer heat spreader of the PoP package of FIG. 13.
Figure 15:
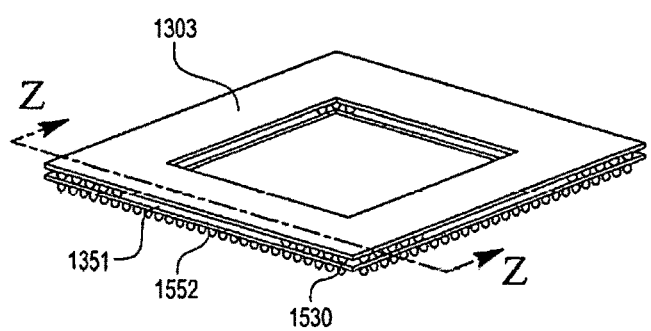
FIG. 15 is a perspective view of the interposers of the PoP package of FIG. 14.
Figure 16:
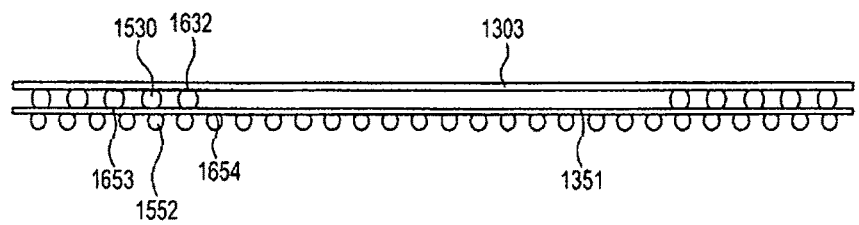
FIG. 16 is a cross-sectional side view of the interposers of FIG. 15.
Figure 17:
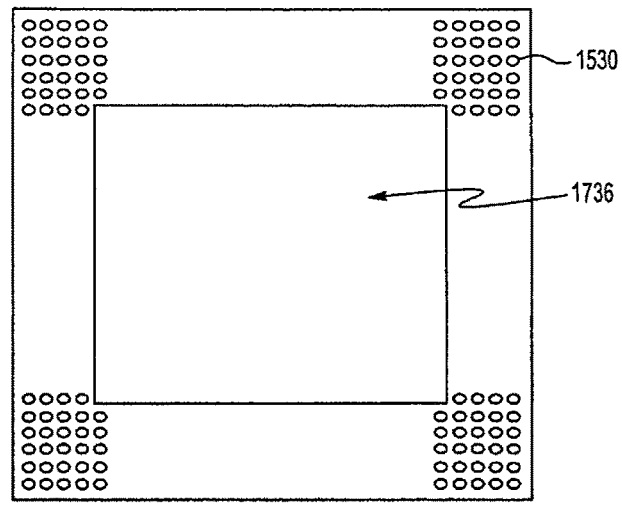
FIG. 17 is a bottom view of the top interposer of FIG. 14.
Figure 18:
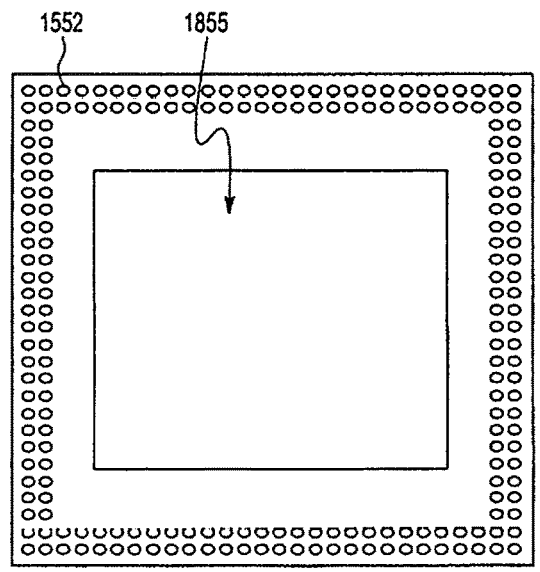
FIG. 18 is a bottom view of the bottom interposer of FIG. 14.
Figure 19:
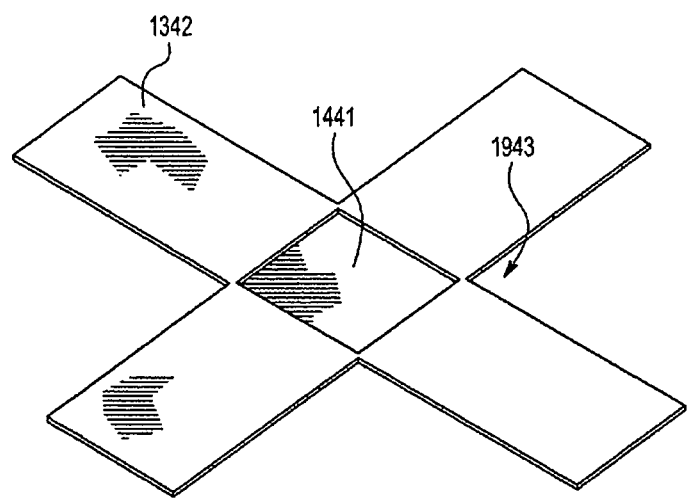
FIG. 19 is a perspective view of the heat spreader of FIG. 14.
Figure 20:
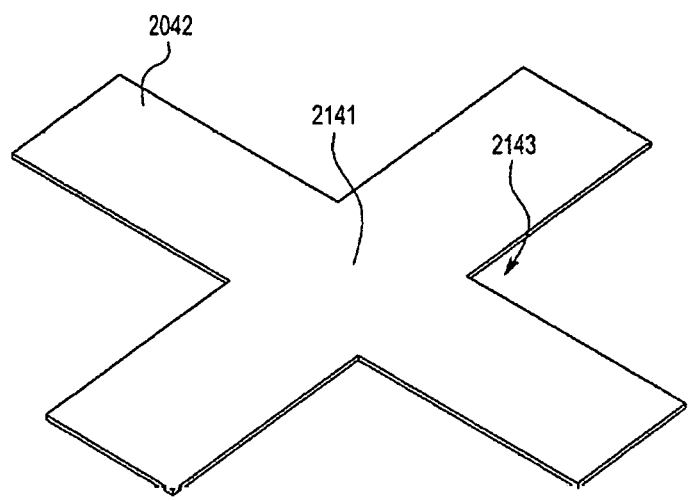
FIG. 20 is a perspective view of a heat spreader in accordance with an alternative implementation of the PoP package of FIG. 13.

FIG. 13 is a perspective view of a PoP package 1300 in accordance with yet another alternative implementation of the invention. FIG. 14 is a perspective view of the top interposer 1303, the bottom interposer 1351, and the interposer heat spreader 1340 of the PoP package 1300 of FIG. 13. FIG. 15 is a perspective view of the interposers 1303 and 1351 of the PoP package 1300 of FIG. 14. FIG. 16 is a cross-sectional side view of the interposers 1303 and 1351 along cut-line Z-Z of FIG. 15. FIG. 17 is a bottom view of the top interposer 1303 of FIG. 14. FIG. 18 is a bottom view of the bottom interposer 1351 of FIG. 14. FIG. 19 is a perspective view of the heat spreader 1340 of FIG. 14. FIG. 20 is a perspective view of a heat spreader 2040, in accordance with an alternative implementation of the PoP package 1300 of FIG. 13. Note that elements of the PoP package 1300 that correspond to elements of the PoP package 200 are similarly labeled but with a different prefix.

The PoP package 1300 uses a pair of interposers, namely, the top interposer 1303 above the heat spreader 1340 and the bottom interposer 1351 below the heat spreader 1340, rather than only one interposer as in the PoP package 200 of FIG. 2. The top interposer 1303 is substantially similar to the interposer 203 of FIGS. 2-4, comprising top contact pads (see FIGS. 3-4), bottom contact pads 1632, a filler (see FIG. 4), conductive paths (see FIG. 4) interconnecting the top contact pads to the corresponding bottom contact pads 1632, an opening 1736, and conductive balls 1530. The top contact pads of the top interposer 1303 correspond to the bottom contact pads (see FIG. 1) of the top package 1302.

The bottom interposer 1351 is in the shape of a rectangular frame having a central rectangular opening 1855. The opening 1855 is to accommodate the die (not shown) of the bottom package 1301 and/or the central section 1441 of the heat spreader 1340. The bottom interposer 1351 comprises top contact pads 1653, bottom contact pads 1654, a filler (not shown), and interconnects (not shown) electrically connecting the top contact pads 1653 to the corresponding bottom contact pads 1654. The top contact pads 1653 of the bottom interposer 1351 correspond to the bottom contact pads 1632 and the conductive balls 1530 of the top interposer 1303. Corresponding conductive balls 1552 are attached to the bottom contact pads 1654.

The bottom contact pads 1654 correspond to the top contact pads (not shown) of the bottom package 1301. The bottom interposer 1351 is used to provide a redistribution layer between the bottom contact pads 1632 of the top interposer 1303—having a four-corner pattern—and the top contact pads of the bottom package 1301—having a plurality-of-concentric-rectangles pattern. In alternative implementations, the bottom interposer 1351 may be used in order to interconnect—as a redistribution layer—the bottom contact pads 1632 of the top interposer 1303 to any non-corresponding pattern of top contact pads of the bottom package 1301.

The heat spreader 1340 comprises a central section 1441 and four arms 1342 that extend out past the edges of the bottom package 1301, and also has openings 1943. Because of the additional elevation above the bottom package 1301 that is provided to the arms 1342 by the bottom interposer 1351, the central section 1441 of the heat spreader 1340 is depressed with respect to the arms 1342 so that the bottom of the central section 1441 contacts the die (not shown) of the bottom package 1301.

Note that, depending on the height of the die of the bottom package 1301 and of the bottom interposer 1351 (including the conductive balls 1552), the central section of the heat spreader may, instead, be elevated, as in the heat spreader 240 of FIG. 2 or be level with the arms, as in the heat spreader 2040 of FIG. 20, which comprises a central section 2041 that is level with the arms 2042, and also includes openings 2043. Since the central sections 1441 and 2041 of the alternative heat spreaders 1340 and 2040, respectively, do not rise above the arms 1342 and 2042, respectively, a corresponding top interposer does not require an accommodating opening such as the opening 336 of the interposer 203.

Figure 21:
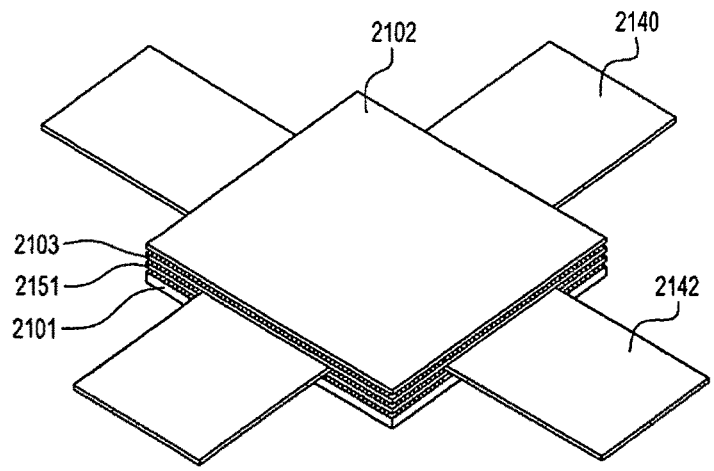
FIG. 21 is a perspective view of a PoP package in accordance with another alternative implementation of the invention.
Figure 22:
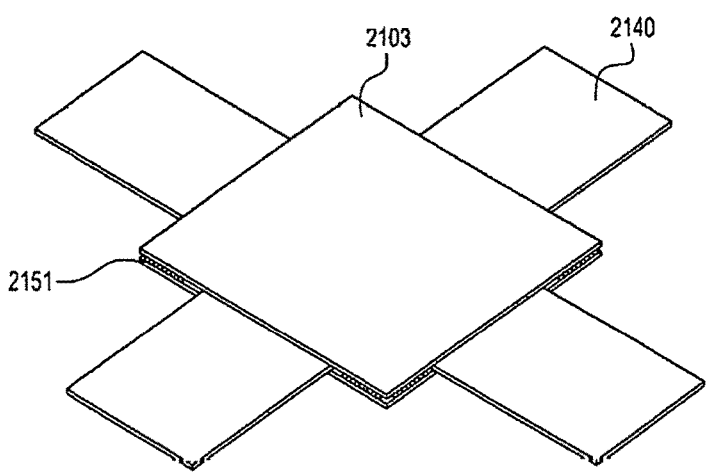
FIG. 22 is a perspective view of the top interposer, the bottom interposer, and the interposer heat spreader of the PoP package of FIG. 21.
Figure 23:
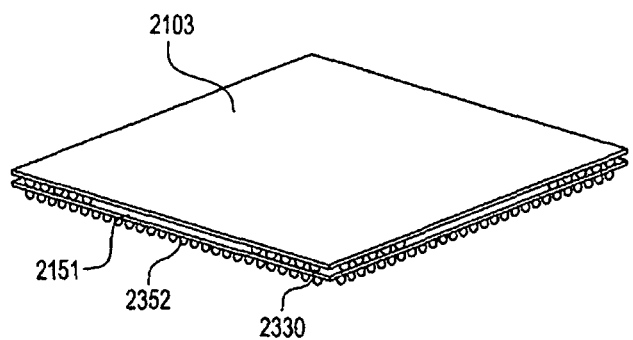
FIG. 23 is a perspective view of the interposers of the PoP package of FIG. 22.
Figure 24:
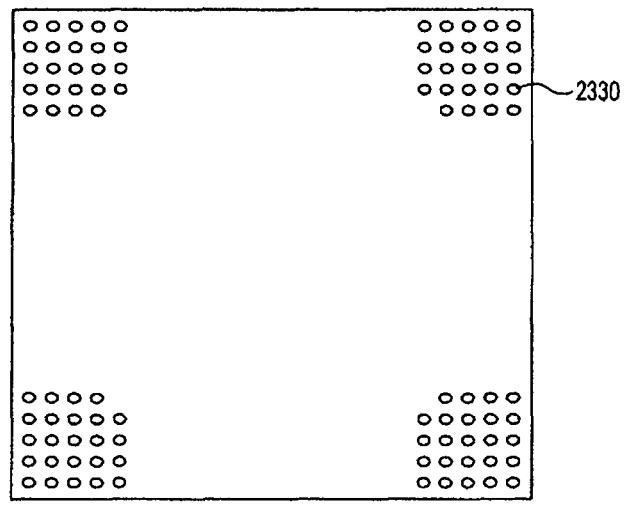
FIG. 24 is a bottom view of the top interposer of FIG. 22.

FIG. 21 is a perspective view of a PoP package 2100 in accordance with another alternative implementation of the invention. FIG. 22 is a perspective view of the top interposer 2103, the bottom interposer 2151, and the interposer heat spreader 2140 of the PoP package 2100 of FIG. 21. FIG. 23 is a perspective view of the interposers 2103 and 2151 of the PoP package 2100 of FIG. 22. FIG. 24 is a bottom view of the top interposer 2103 of FIG. 22.

Other than the difference described below, the elements of the PoP package 2100 are substantially similar to the corresponding elements of the PoP package 1300 of FIG. 13 and are similarly labeled, but with a different prefix. The top interposer 2103, unlike the top interposer 1303 of the PoP package 1300, does not have a central opening like the opening 1736 of FIG. 17. In other words, the top interposer 2103 is rectangular rather than frame-like in shape. This means that the top contacts (not shown) of the top interposer 2103 may be in any pattern and are not restricted to the perimeter area of the top interposer 2103. This allows for greater flexibility in selecting a compatible top package 2102 for the PoP package 2100. Note, however, that the top interposer 2103 has its bottom contact pads (not shown) and corresponding conductive balls 2330 in the corners—similarly to the bottom contact pads 1632 and the conductive balls 1530 of the top interposer 1303.

It should be noted that the types of dies in the various packages are not limited to processors and memory modules and the top and bottom packages may comprise dies and/or modules of any suitable type. It should also be noted that alternative PoP package embodiments may comprises more than two vertically stacked packages, in which case at least one inter-package interface includes at least an interposer heat spreader. It should be further noted that the bottom package may include more than one die, which may be interconnected to each other, the corresponding substrate, and/or other components in any suitable manner.

Embodiments of the invention have been described where the top and bottom packages connect to an interposer and/or other components using conductive balls. The invention is not, however, so limited. In alternative embodiments different interconnectors—such as, for example, pins, bumps, or vias—are used instead of conductive balls.

An embodiment of the invention have been described where the heat spreader 240 of FIG. 2 is formed by a sheet-metal shaping process. The invention is not, however, so limited. The heat spreader 240 may alternatively be formed by, for example, fusing, welding, or otherwise thermo-conductively attaching the central section 241 to the arms 242. In other alternative implementations, the heat spreader 240 may be formed from a metal block by milling, etching, or any other suitable subtractive process. In other alternative embodiments, the heat spreader 240 may be formed by, for example, a molding or casting process. In other alternative embodiments, the heat spreader 240 may be formed by any suitable 3-D printing technique.

Embodiments of the invention have been described where the interposer heat spreader comprises four rectangular arms that extend out from the PoP package. The invention is not, however, so limited. In alternative embodiments, more or fewer heat spreader arms may extend out from the PoP package. In some alternative embodiments, one or more of the arms may have shapes other than those described above—e.g., semi-circular or elliptical. In addition, in some alternative embodiments, one or more of the arms may be bent in ways other than described above—e.g., in an oscillating wave pattern.

Embodiments of the invention have been described where a PoP package comprises an interposer between the top package and the bottom package, which functions like a redistribution layer. Note, however, that in some alternative embodiments, the bottom contact pads of the top package are arranged to match the top contact pads of the bottom package, and the top package is attached directly to the bottom package and the heat spreader without the use of an interposer.

Embodiments of the invention have been described having particular features. Unless otherwise indicated, alternative embodiments of the invention may mix and match different combinations of above-described features. For example, one alternative implementation may combine bent heat-spreader arms with heat sinks on the bent arms.

It will be further understood that various changes in the details, materials, and arrangements of the parts which have been described and illustrated in order to explain the nature of this invention may be made by those skilled in the art without departing from the scope of the invention as expressed in the following claims.

Reference herein to "one embodiment" or "an embodiment" means that a particular feature, structure, or characteristic described in connection with the embodiment can be included in at least one embodiment of the invention. The appearances of the phrase "in one embodiment" in various places in the specification are not necessarily all referring to the same embodiment, nor are separate or alternative embodiments necessarily mutually exclusive of other embodiments. The same applies to the term "implementation."

Unless explicitly stated otherwise, each numerical value and range should be interpreted as being approximate as if the word "about" or "approximately" preceded the value of the value or range. As used in this application, unless otherwise explicitly indicated, the term "connected" is intended to cover both direct and indirect connections between elements.

The embodiments covered by the claims in this application are limited to embodiments that (1) are enabled by this specification and (2) correspond to statutory subject matter. Non-enabled embodiments and embodiments that correspond to non-statutory subject matter are explicitly disclaimed even if they fall within the scope of the claims.

In this specification including any claims, the term "each" may be used to refer to one or more specified characteristics of a plurality of previously recited elements or steps. When used with the open-ended term "comprising," the recitation of the term "each" does not exclude additional, unrecited elements or steps. Thus, it will be understood that an apparatus may have additional, unrecited elements and a method may have additional, unrecited steps, where the additional, unrecited elements or steps do not have the one or more specified characteristics.

Although the steps in the following method claims are recited in a particular sequence with corresponding labeling, unless the claim recitations otherwise imply a particular sequence for implementing some or all of those steps, those steps are not necessarily intended to be limited to being implemented in that particular sequence.

The invention claimed is:

1. An article of manufacture, comprising:
   a first integrated circuit (IC) package comprising a die and a substrate, wherein:
   the substrate comprises die contact pads, top contact pads, bottom contact pads, and first electrical interconnects among the die contact pads, the top contact pads, and the bottom contact pads; and
   the die is electrically connected to the die contact pads;
   a heat spreader, wherein:
   the heat spreader comprises a central section thermo-conductively connected to the die;
   the heat spreader comprises at least one arm connected to the central section and extending out past an edge of the first IC package; and
   the heat spreader has one or more openings for second electrical interconnects connected to the first IC package; and
   a first interposer in a shape of a frame having an opening that accommodates the central section of the heat spreader, the first interposer comprising:
   first-interposer top contact pads;
   first-interposer bottom contact pads electrically connected, by way of the second electrical interconnects, to the top contact pads of the substrate of the first IC package; and
   a redistribution layer electrically connecting the first-interposer top contact pads to corresponding first-interposer bottom contact pads.

2. The article of claim 1, wherein:
   the first IC package has four side edges; and
   the heat spreader comprises four arms, each connected to the central section and extending past a corresponding side edge of the first IC package.

3. The article of claim 2, further comprising four heat sinks, each attached to a respective one of the four arms.

4. The article of claim 1, wherein the central section is elevated relative to the at least one arm in order to accommodate the die.

5. The article of claim 1, further comprising a heat sink attached to the at least one arm.

6. The article of claim 1, wherein the heat spreader further comprises an outer ring connected to the at least one arm.

7. The article of claim 1, wherein the at least one arm has a bend in a section thereof located past the edge of the first IC package.

8. The article of claim 1, wherein:
   the frame is a rectangular frame having four corner regions;
   the first-interposer bottom contact pads are located in the corner regions; and
   the first-interposer top contact pads are arranged in a plurality of concentric rectangles.

9. The article of claim 1, wherein:
   the first interposer further comprises conductive balls attached to the first-interposer bottom contact pads and to corresponding top contact pads of the substrate of the first IC package; and
   the conductive balls form a part of the second electrical interconnects.

10. The article of claim 1, further comprising a second IC package electrically connected to the first-interposer top contact pads to form a package-on-package (PoP) package, wherein:
    the second IC package comprises a second substrate and a second die electrically connected to the second substrate;
    the second substrate comprises bottom contact pads electrically connected to the second die; and
    the PoP package comprises conductive balls attached between the bottom contact pads of the second substrate and the first-interposer top contact pads.

11. The article of claim 10, further comprising:
    a first heat sink attached to a top of the second IC package; and
    a second heat sink attached to the at least one arm.

12. The article of claim 10,
    further comprising a second interposer in a shape of
    a rectangular frame having an opening that accommodates the central section of the heat spreader,
    the second interposer comprising:
    second-interposer top contact pads corresponding to and electrically connected to the first-interposer bottom contact pads through the one or more openings in the heat spreader; and
    second-interposer bottom contact pads corresponding to and electrically connected to the top contact pads of the substrate of first IC package; and
    wherein the second-interposer top contact pads are electrically connected to the second-interposer bottom contact pads.

13. An article of manufacture, comprising:
    a first integrated circuit (IC) package comprising a die and a substrate, wherein:
    the substrate comprises die contact pads, top contact pads, bottom contact pads, and first electrical interconnects among the die contact pads, the top contact pads, and the bottom contact pads;
    the die is electrically connected to the die contact pads; and
    the top contact pads are electrically connected to a second IC package to form a package-on-package (POP) package; and
    a heat spreader, wherein:
    the heat spreader comprises a central section thermo-conductively connected to the die;
    the heat spreader comprises at least one arm connected to the central section and extending out past a side edge of the first IC package; and
    the heat spreader has one or more openings for second electrical interconnects between the first IC package and the second IC package; and
    a heat sink attached to the at least one arm.

14. The article of claim 13, wherein:
    the first IC package has four side edges;
    the heat spreader comprises four arms, each connected to the central section and extending past a corresponding side edge of the first IC package; and
    four heat sinks, each attached to a respective one of the four arms.

15. An article of manufacture, comprising:
    a first integrated circuit (IC) package comprising a die and a substrate, wherein:
    the substrate comprises die contact pads, top contact pads, bottom contact pads, and first electrical interconnects among the die contact pads, the top contact pads, and the bottom contact pads;

the die is electrically connected to the die contact pads; and the top contact pads are electrically connected to a second IC package to form a package-on-package (POP) package;

a heat spreader, wherein:
  the heat spreader comprises a central section thermo-conductively connected to the die;
  the heat spreader comprises at least one arm connected to the central section and extending out past an edge of the first IC package; and
  the heat spreader has one or more openings for second electrical interconnects between the first IC package and the second IC package;

a first interposer comprising:
  first-interposer top contact pads electrically connected to the second IC package;

first-interposer bottom contact pads electrically connected to the top contact pads of the substrate of the first IC package through the one or more openings in the heat spreader; and a redistribution layer electrically connecting the first-interposer top contact pads to corresponding first-interposer bottom contact pads; and a second interposer in a shape of a rectangular frame having an opening and four corner regions, the second interposer comprising:
  second-interposer top contact pads in the corner regions corresponding to and electrically connected to the first-interposer bottom contact pads through the one or more openings in the heat spreader; and
  second-interposer bottom contact pads corresponding to and electrically connected to the top contact pads of the substrate of the first IC package; and
  wherein the second-interposer top contact pads are electrically connected to the second-interposer bottom contact pads.

16. The article of claim 15, wherein the PoP package includes conductive balls attached to the first-interposer bottom contact pads and the second-interposer top contact pads, wherein the conductive balls form a part of the second electrical interconnects between the first IC package and the second IC package.

17. The article of claim 15, wherein the PoP package further comprises conductive balls attached to the second-interposer bottom contact pads and to the top contact pads of the substrate of the first IC package.

18. The article of claim 15, wherein:
  the first interposer is in a shape of a rectangle having four corner regions and no openings;
  the first interposer is located above the heat spreader; and
  the first-interposer bottom contact pads are located in the corner regions.

19. The article of claim 15, wherein the central section of the heat spreader is depressed relative to the at least one arm.

20. The article of claim 15, wherein the central section of the heat spreader is level with the at least one arm.

* * * * *